US008188899B2

(12) United States Patent
Motamed

(10) Patent No.: US 8,188,899 B2
(45) Date of Patent: May 29, 2012

(54) UN-BUFFERED SEGMENTED R-DAC WITH SWITCH CURRENT REDUCTION

(75) Inventor: Ali Motamed, San Francisco, CA (US)

(73) Assignee: Intersil Americas, Inc., Milpitas, CA (US)

( * ) Notice: Subject to any disclaimer, the term of this patent is extended or adjusted under 35 U.S.C. 154(b) by 0 days.

(21) Appl. No.: 12/713,841

(22) Filed: Feb. 26, 2010

(65) Prior Publication Data

US 2010/0245145 A1 Sep. 30, 2010

Related U.S. Application Data

(60) Provisional application No. 61/165,317, filed on Mar. 31, 2009.

(51) Int. Cl.
*H03M 1/66* (2006.01)

(52) U.S. Cl. ............. 341/145; 341/144; 341/154

(58) Field of Classification Search .............. 341/144, 341/145, 154
See application file for complete search history.

(56) References Cited

U.S. PATENT DOCUMENTS

| 5,495,245 | A | 2/1996 | Ashe |
| 5,648,780 | A | 7/1997 | Neidorff |
| 6,268,817 | B1* | 7/2001 | Min et al. ............ 341/145 |
| 6,414,616 | B1 | 7/2002 | Dempsey |
| 6,914,547 | B1* | 7/2005 | Swaroop et al. ........ 341/144 |
| 7,242,338 | B2* | 7/2007 | Jiang et al. ........... 341/154 |
| 7,425,941 | B2* | 9/2008 | Sung et al. ............. 345/98 |
| 7,501,970 | B2* | 3/2009 | Trifonov et al. ........ 341/145 |
| 7,554,475 | B2* | 6/2009 | Ginosar et al. ......... 341/154 |
| 7,639,166 | B2* | 12/2009 | Iijima ................ 341/145 |
| 2005/0052305 | A1 | 3/2005 | Voicu et al. |
| 2005/0117071 | A1 | 6/2005 | Johnson |

FOREIGN PATENT DOCUMENTS

| EP | 1 050 970 A2 | 11/2000 |
| WO | WO 2006/103673 A2 | 10/2006 |

OTHER PUBLICATIONS

European Search Report for European Application No. EP 10 15 7599; Date Mailed: Jul. 23, 2010, incomplete—only 3 pages provided.

* cited by examiner

*Primary Examiner* — Khai M Nguyen

(74) *Attorney, Agent, or Firm* — Hamilton, Brook, Smith & Reynolds, P.C.

(57) ABSTRACT

An resistor string digital-to-analog converter (DAC) that includes elements to compensate for resistor ladder loading, and/or to provide compensation for loading such as via switch current cancellation. The approach reduces output voltage sensitivity to switch resistances while also reducing INL and DNL errors. Additional resistor loops are optionally disposed at the top and bottom of one or more further segments to provide $N^{th}$ order resistive current cancellation.

19 Claims, 14 Drawing Sheets

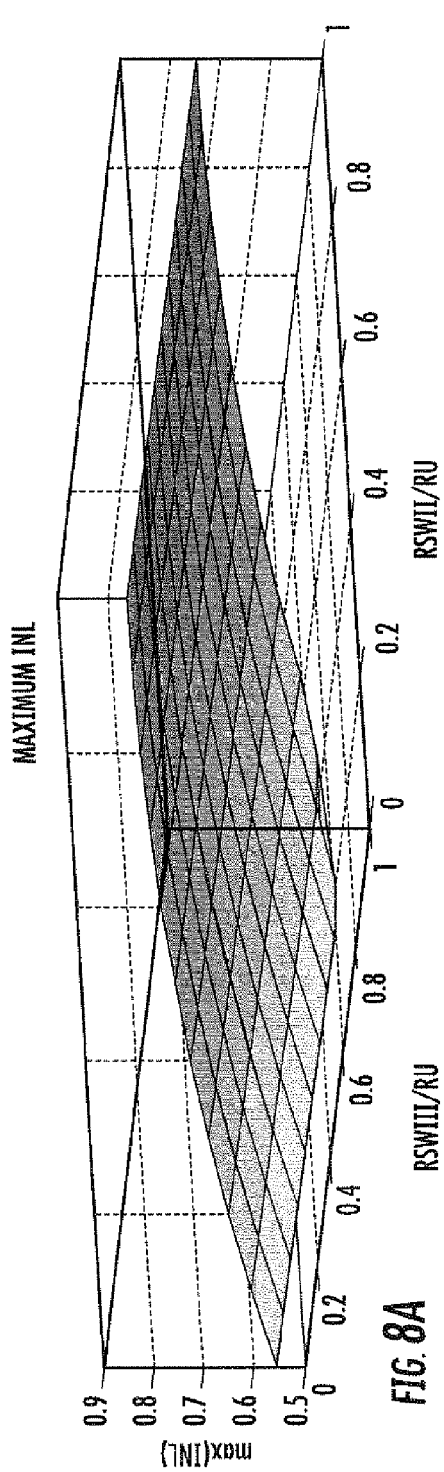
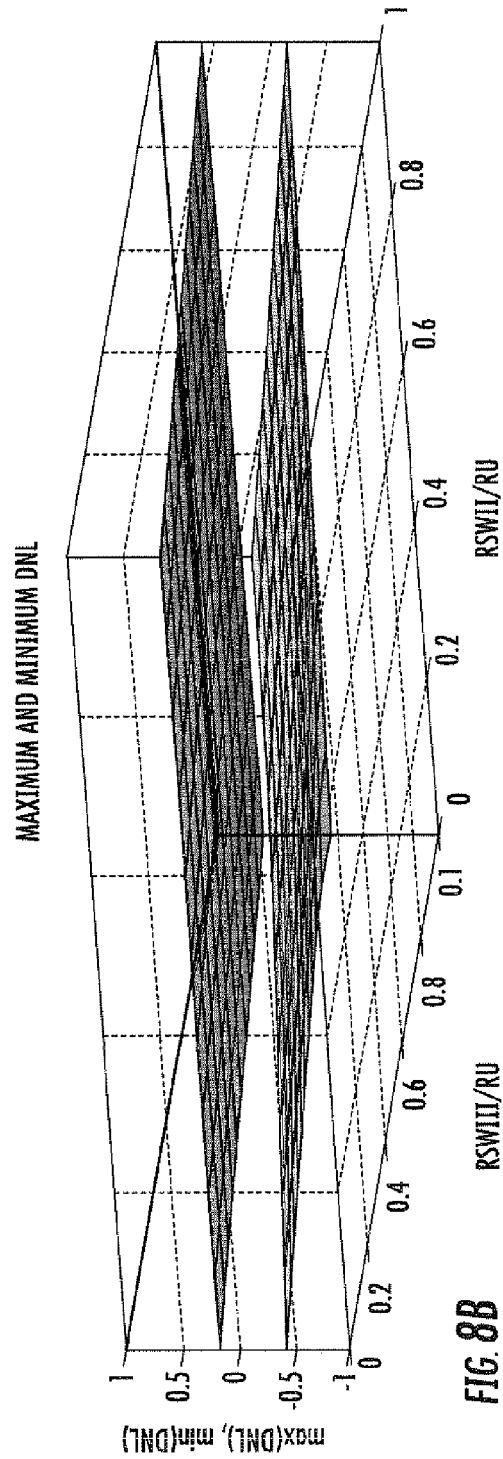
FIG. 8A
FIG. 8B

US 8,188,899 B2

UN-BUFFERED SEGMENTED R-DAC WITH SWITCH CURRENT REDUCTION

RELATED APPLICATION(S)

This application claims the benefit of U.S. Provisional Application No. 61/165,317, filed on Mar. 31, 2009. The entire teachings of the above application(s) are incorporated herein by reference.

BACKGROUND

A Digital to Analog Converter (DAC) is a circuit that takes a number of digital bits as input and produces a corresponding analog output. One approach to DAC design is so-called resistor-string or R-DAC. That circuit topology arranges a number of resistors in series between a high and low reference voltage. An array of switches coupled to the resistors are controlled by the digital input bits to determine the output. The number of resistors depends on the desired resolution of the DAC—in the simplest conceptual approach for an 17-bit converter, for example, $2^{17}-1$ or 131,070 resistors are typically needed to provide all possible output levels.

A "segmented" R-DAC reduces the total number of required resistors by using multiple string segments. The first segment, controlled by most significant input bits, provides a coarse output approximation. The second and subsequent segments, controlled by lesser significant bits, provides finer selection of the output.

Resistor-string DACs are a suitable architecture when monotonicity is a major concern. However, this architecture is not practical for high-resolution DACs, as the number of elements increases exponentially with resolution. Consequently, segmented R-DAC architectures usually strike the right compromise between monotonicity and complexity for high resolution DACs. Segmented R-DAC architectures have the drawback of requiring buffer elements to alleviate resistor ladder loading caused by subsequent segments. Buffers are undesirable since they increase power consumption and are a major source of noise. In addition, for rail-to-rail operation the input offset transitions of the buffer can cause nonmonotonicity. Un-buffered segmented R-DAC architectures thus are also possible.

Of interest is U.S. Pat. No. 5,703,588 issued to Rivoir et al. which describes a dual resistor string R-DAC that uses current biasing to isolate a first resistor segment from a second resistor segment. Specifically, to prevent the second resistor segment from drawing current from the first resistor segment, a current source feeds a bias current into the second segment and a current drain draws bias current from the second segment.

SUMMARY

Proposed herein is a new approach to the implementation of an un-buffered, segmented R-DAC architecture.

In one embodiment, a new topology for an R-DAC compensates for resistor ladder loading.

Moreover, a switch current cancellation scheme can reduce R-DAC output voltage sensitivity to switch resistances and reduces Integral Non-Linearity (INL) and Differential Non-Linearity (DNL) errors.

In certain embodiments, the proposed architecture uses only resistors and switches and can be implemented for any resolution and any number of segments.

BRIEF DESCRIPTION OF THE DRAWINGS

FIGS. 8A and 8B are a result of a simulation to illustrate the maximum INL, minimum and maximum DNL for the "truss" architecture of FIG. 6B as a function of normalized switch resistances.

DETAILED DESCRIPTION OF PREFERRED EMBODIMENTS

Figure 1:
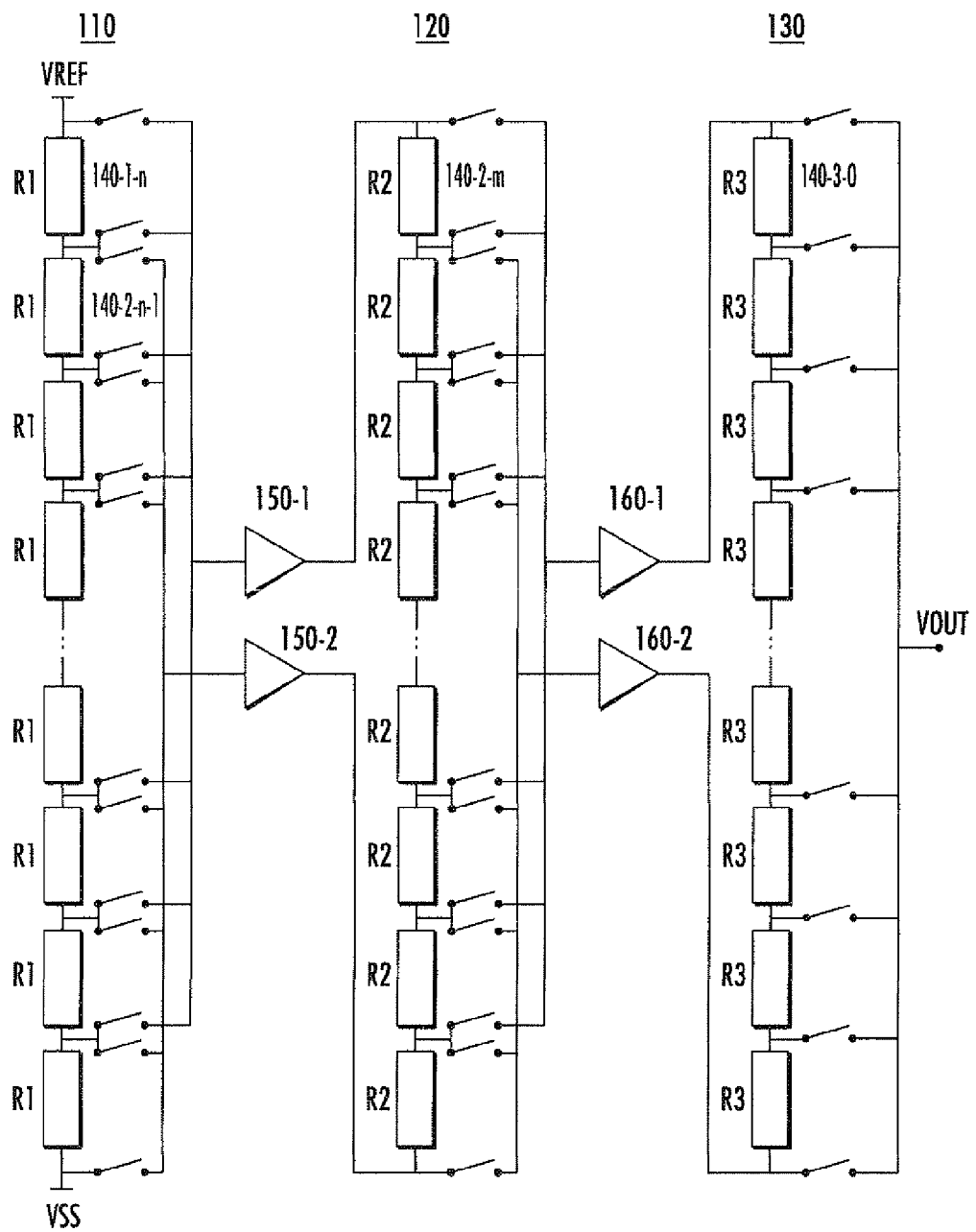
FIG. 1 is a high level diagram of an R-DAC architecture.

A three-segment buffered R-DAC 100 is shown in FIG. 1. This architecture can be readily generalized to other numbers of segments, such as two segments or more than three segments. The rectangles represent resistance "sub-segments" 140-1-1, 140-1-2, . . . 140-2-1 140-2-2, 140-2-3, . . . , 140-3-1, 140-3-2, . . . , etc., which may each in fact consist of multiple physical resistors, or more generally, resistive elements. In other words, the segments in the R-DAC may be formed of impedance elements of various types in which the impedance of each element corresponds to a desired resistance, such that each segment is formed of a set of elements that may include a set of resistors. The "resistors" referred to herein may, therefore, further be any number of different types of resistive elements depending on the circuit topology, such as precision thin film resistors formed of SiCr or other materials, or polysilicon (p- or n-doped) in the case of integrated circuits. It also should be understood that the "resistors" described herein can include any circuit element that produces a voltage across its terminals that it proportional to the electric current passing through it.

More particularly, the first segment 110 is represented by the resistors in the left hand column. The second segment 120 is represented by the resistors in the middle column and the third segment 130 is represented by the resistors in the right hand column. Note that the resistors R1, R2, R3, etc., may differ in each segment. The segments are isolated by four voltage buffers, 150-1, 150-2, 160-1, 160-2. These voltage buffers increase power consumption and can be a major noise source.

Figure 2:
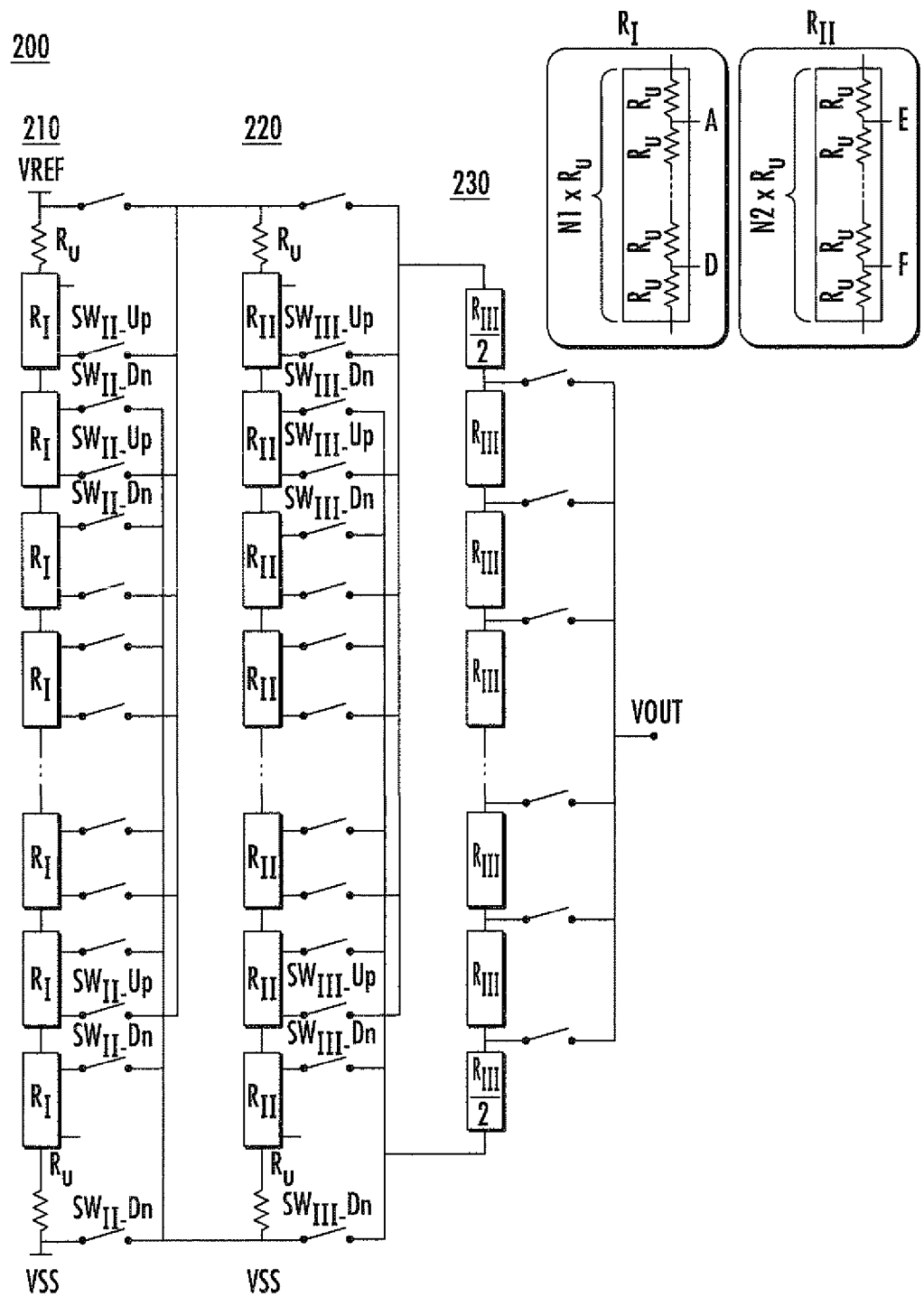
FIG. 2 is a segmented R-DAC architecture according to one embodiment.

An un-buffered DAC 200 architecture is shown in FIG. 2. This figure shows a DAC with three segments 210, 220, 230 but can be generalized to any number of segments. Here the first 210, second 220 and third 230 segments each resolve m1, m2 and m3 bits respectively. The DAC therefore has an overall resolution of N=m1+m2+m3 bits. In this drawing, more detail of the sub-segments is shown. For example, each of the first segment's $2^{m1}$ sub-segments 240-1 is comprised of N1 unit resistors $R_U$ (to provide total subsegment resistance R1), and each of the second segment's $2^{m2}$ sub-segments 240-2 is comprised of N2 unit resistors $R_U$ (to provide a total subsegment resistance R2).

The output of the DAC shown in FIG. 2 spans the range of VSS+0.5 LSB to VREF−0.5 LSB.

In order to compensate for the voltage drop caused by the loading of the second segment 220, the connection taps are connected to one or more unit resistors, $R_U$, 215 immediately above the top, and one or more unit resistors, $R_U$, immediately below the bottom of the chosen sub-segment. Switches $SW_{II}$-Up and $SW_{II}$-Dn connect the first segment to the second segment. A similar arrangement is implemented in a switching $SW_{III}$-Up and $SW_{III}$-Dn (228, 229) for connection of the second segment to the third segment via unit resistors 225, 226.

In addition, the third segment 230 of the DAC is implemented as a series connection of two N3/2 unit resistors and $2^{m3}-1$ sub-segments, each comprised of N3 unit resistors $R_U$ (for a total subsegment 230 resistance $2^{m3} R_U$).

Note that not all of the subsegments and inter-segment switches are shown, for the sake of clarity. For example, the total number of taps (switches) from the first segment is $2^{(m1+1)}$. Different arrangements for the third segment are equally valid. For example, connection of $2^{m3}-1$ elements each comprised of N3 unit resistors in series with N3 unit resistors on top can span the range of VSS to VREF-LSB. Similarly, connection of $2^{m3}-1$ elements each comprised of N3 unit resistors in series with N3 unit resistors at the bottom spans the range of VSS+VLSB to VREF. However, the arrangement shown in FIG. 2 is more suitable for a "leapfrog" or "zigzag" implementation.

Unit resistors with the same nominal resistance value but different physical area may be used for different segments such that an optimized linearity-die area tradeoff is reached. Better linearity requires better matching and hence large die area. For example, the resistances of the first segment may be made more linear or match better than those of later segments. It should also be understood that in certain embodiments, the resistance of the unit resistors used for a given segment may not necessarily be the same as the resistance of the unit resistors used in the other segments, as long as the number of resistors times each unit resistance value provides the total desired segment or sub-segment resistance.

Analysis

Figure 3:
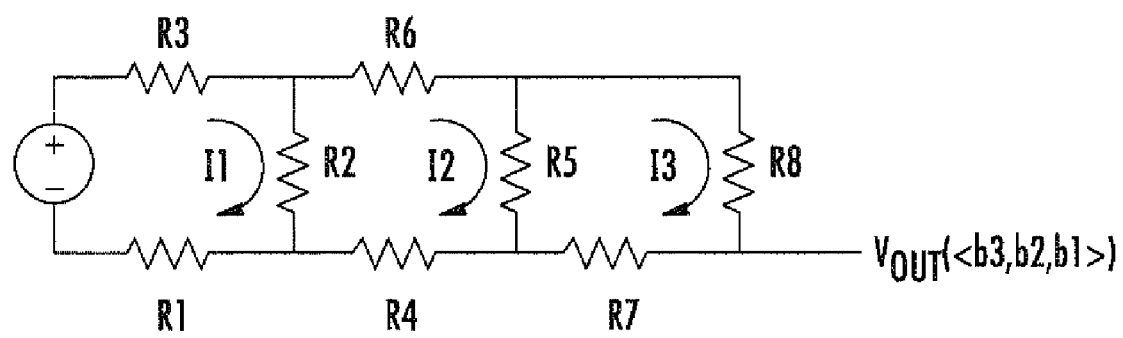
FIG. 3 is a model network for the segmented R-DAC architecture of FIG. 2.

The DAC 200 of FIG. 2 is modeled with the network shown in FIG. 3. R1, R2, and R3 models the first segment and R4, R5, and R6 model the second segment, and finally R7 and R8 model the third segment. If $R_U$ denotes the unit element resistor then we have:

$$R1 = N1 \cdot R_U \sum_{i1=0}^{m1-1} 2^{i1} b1_{(i1)} \tag{1}$$

$$R2 = (N1+2)R_U$$

$$R3 = N1 \left( 2^{m1} - 1 - \sum_{i1=0}^{m1-1} 2^{i1} b1_{(i1)} \right) R_U$$

$$R4 = N2 \cdot R_U \sum_{i2=0}^{m2-1} 2^{i2} b2_{(i2)} + R_{SW_{II}1Dn}$$

$$R5 = (N2+2)R_U$$

$$R6 = N2 \left( 2^{m2} - 1 - \sum_{i2=0}^{m2-1} 2^{i2} b2_{(i2)} \right) R_U + R_{SW_{II}1Up}$$

$$R7 = N3 \left( 0.5 + \sum_{i3=0}^{m3-1} 2^{i3} b3_{(i3)} \right) R_U + R_{SW_{III}1Dn}$$

$$R8 = N3 \left( 2^{m3} - 0.5 - \sum_{i3=0}^{m3-1} 2^{i3} b3_{(i3)} \right) R_U + R_{SW_{III}1Up}$$

where <b1>, <b2>, and <b3> represent partitioned DAC input codes routed to the first, second, and third segments, respectively. Parameters, m1, m2, and m3 are the number of bits resolved by first, second, and third segment, respectively. Parameters N1, N2, and N3 are the number of unit resistors in subsegments of first, second, and third segment, respectively. The network shown FIG. 2 and modeled in FIG. 3 can be represented by:

$$\underline{\underline{R}} \cdot \underline{I} = \underline{S} \tag{2}$$

where R is the network matrix, I is the mesh current vector and S is the network stimulus which in our case is VREF. Equivalently, (2) can be written as $$\begin{pmatrix} N1 \cdot 2^{m1} + 2 & -(N1+2) & 0 \\ -(N1+2) & N2 \cdot 2^{m2} + N1 + 4 + 2R_{SWII} & -(N2+2) \\ 0 & -(N2+2) & N3 \cdot 2^{m3} + N2 + 2(1+R_{SWII}) \end{pmatrix} \begin{pmatrix} I1 \\ I2 \\ I3 \end{pmatrix} = \begin{pmatrix} \frac{VREF}{R_U} \\ 0 \\ 0 \end{pmatrix} \tag{3}$$

Subsequently, the DAC output voltage is $$Vout = I1 \cdot N1 \cdot R_U \sum_{i1=0}^{m1-1} 2^{i1} b1_{(i1)} + I2 \left( R_{SWII} + R_U N2 \sum_{i2=0}^{m2-1} 2^{i2} b2_{(i2)} \right) + I3 \left( R_{SWIII} + N3 \cdot R_U \left( 0.5 + \sum_{i3=0}^{m3-1} 2^{i3} b3_{(i3)} \right) \right) \tag{4}$$

Note that as expected I1, I2, and I3 (solution of Eq. 3) are independent of DAC input code and therefore power dissipation is not code dependent. This is an important advantage of string R-DAC architecture compared to R-R2R architectures. Constant power dissipation relaxes resistor temperature coefficient (Tempco) requirement.

Resistor type and size can be optimized for best matching and not necessarily for the best temperature coefficient. Also, as is expected, the LSB voltage defined as $$VLSB = I3 \cdot R_{U,N}3 \tag{5}$$

is constant and independent of DAC bit settings. The ideal LSB size for a DAC with resolution of N=m1+m2+m3 and 0.5 LSB offset is $$VLSB_{ideal} = \frac{VREF}{2^{m1+m2+m3}} \tag{6}$$

The number of subsegments m1, m2, and m3 and the number of unit resistors per subsegment N1, N2, and N3 can be set to minimize a desired error function. One possible error function is DNL defined as:

$$|DNL| = \left| \frac{VLSB - VLSB_{ideal}}{VLSB_{ideal}} \right| \tag{7}$$

In order to minimize |DNL| we need to find a set of integers that best satisfy the following conditions:

$$N3 \cdot 2^{m3} \| (N2+2) = N2 \tag{8}$$

and $$N2 \cdot 2^{m2} \| (N1+2) = N1 \tag{9}$$

These two requirements are stating our goal as to have an exact same equivalent parallel resistance as we would have for an uncorrected but buffered segmented string R-DAC.

As a practical issue, we are interested in smallest set of integers that simultaneously satisfy or closely satisfy (8) and (9).

For example, one such set for a 17 bit DAC with m1=4, m2=6, and m3=7 is:

N1=52.07→52

N2=21.65→22

N3=2 (10)

Figure 4A:
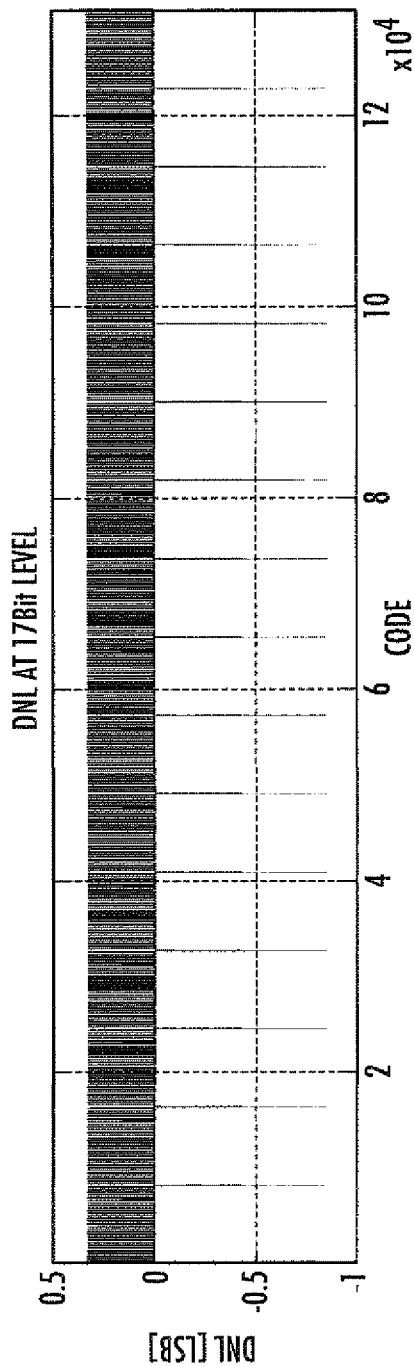
FIG. 4A shows Differential Non Linearity (DNL) error for a particular arrangement.
Figure 4B:
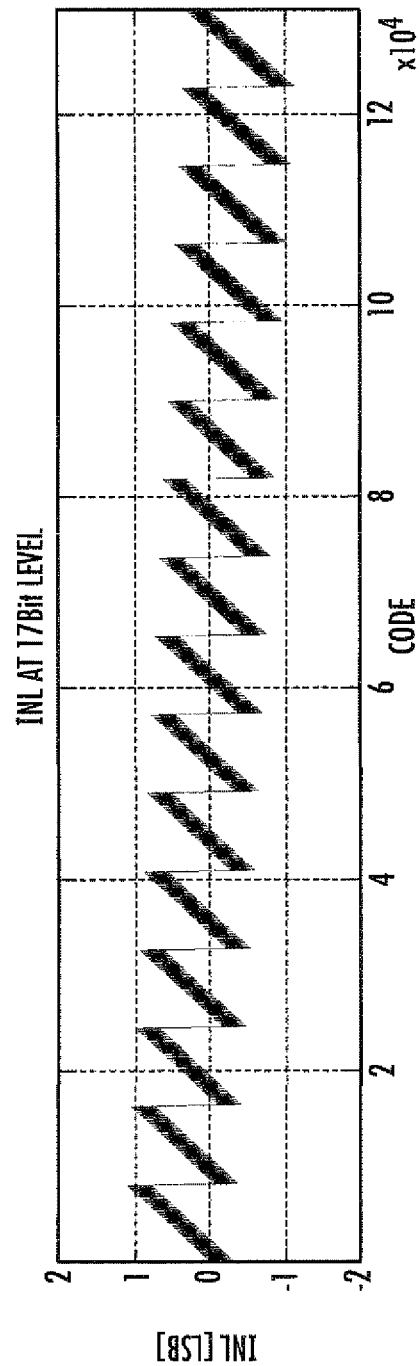
FIG. 4B shows Integral Non-Linearity (INL) error for a particular arrangement.

Eq. (8) and (9) do not include the effect of switch resistances. In general when this and other second order effects are included a numerical routine may provide a more optimized (in terms of a defined error function e.g. Eq. 7) values for N1, N2, and N3. Due to the inevitable rounding in (10) the DAC will have a residual DNL and INL errors as shown in FIGS. 4A and 4B, respectively.

Effect of Switch Resistance

Figure 5A:
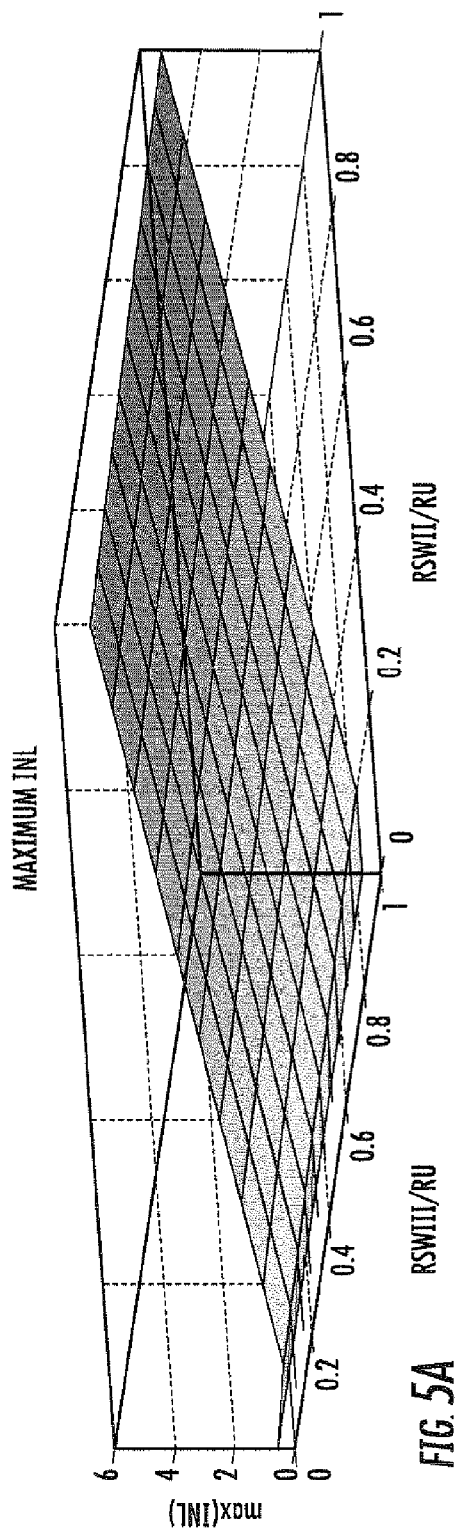
FIGS. 5A and 5B show a maximum absolute value of D and L as a function of segment 2 and segment 3 switch resistances.
Figure 5B:
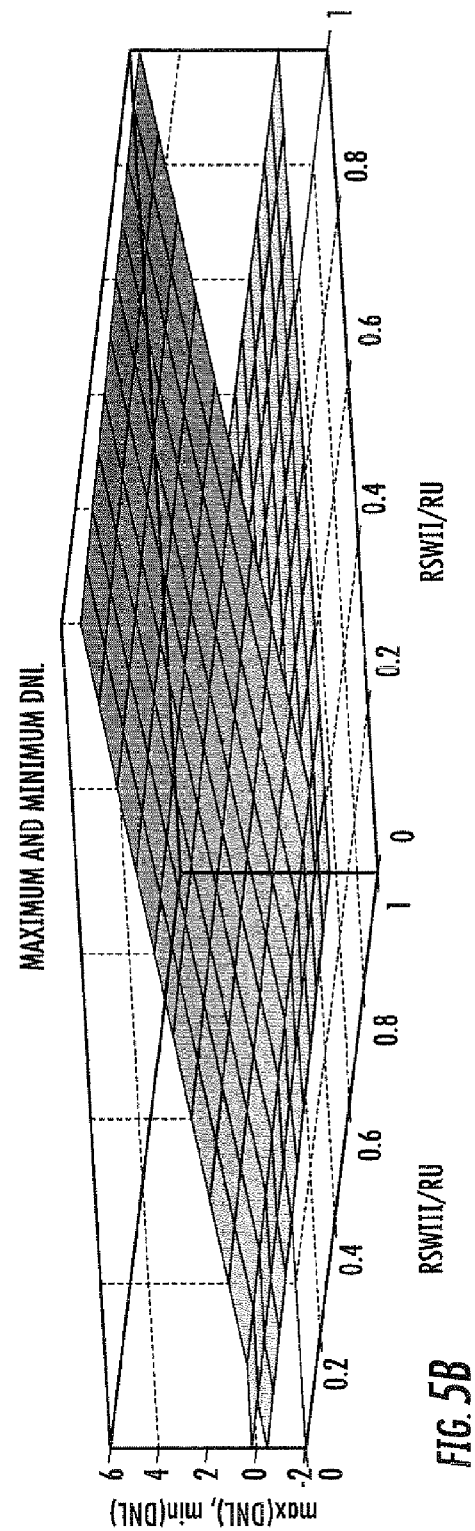

Switch resistances can cause and errors. The switches that connect segment 2 (220) to segment 1 (210) are modeled by $RS_{WII}$-Up and $RS_{WII}$-Dn, and those that connect segment 3 (230) to segment 2 (220) are modeled by $RS_{WIII}$-Up and $RS_{WIII}$-Dn. The resistance of the top and the bottom switch are usually different. However, for of 1.25V and m1=4 and m2=6 the voltage difference is ~78 mV and ~1.2 mV for the first and the second segment, respectively. Therefore, to simplify the model we assume top and bottom switches have equal resistances that is $RS_{WII}$-Up=$RS_{WII}$-Dn=$RS_{WII}$ and $RS_{WIII}$-Up=$RS_{WIII}$-Dn=$RS_{WIII}$ FIGS. 5A and 5B show maximum INL and maximum and minimum DNL at 16 bit level as a function of $RS_{WIII}$/RU and $RS_{WII}$/RU where, swept from 0 to 1. As expected, INL and DNL errors are more sensitive to $RS_{WII}$.

As an example, for a maximum INL<1 we need $R_{SWII} < 0.4 R_U$. Switches with low resistance are large and their undesirable leakage current introduce more nonlinearity. Two improvements to this architecture that can reduce switch resistance sensitivity are discussed in the next section.

DAC Architecture with Switch Current Cancellation

Figure 6A:
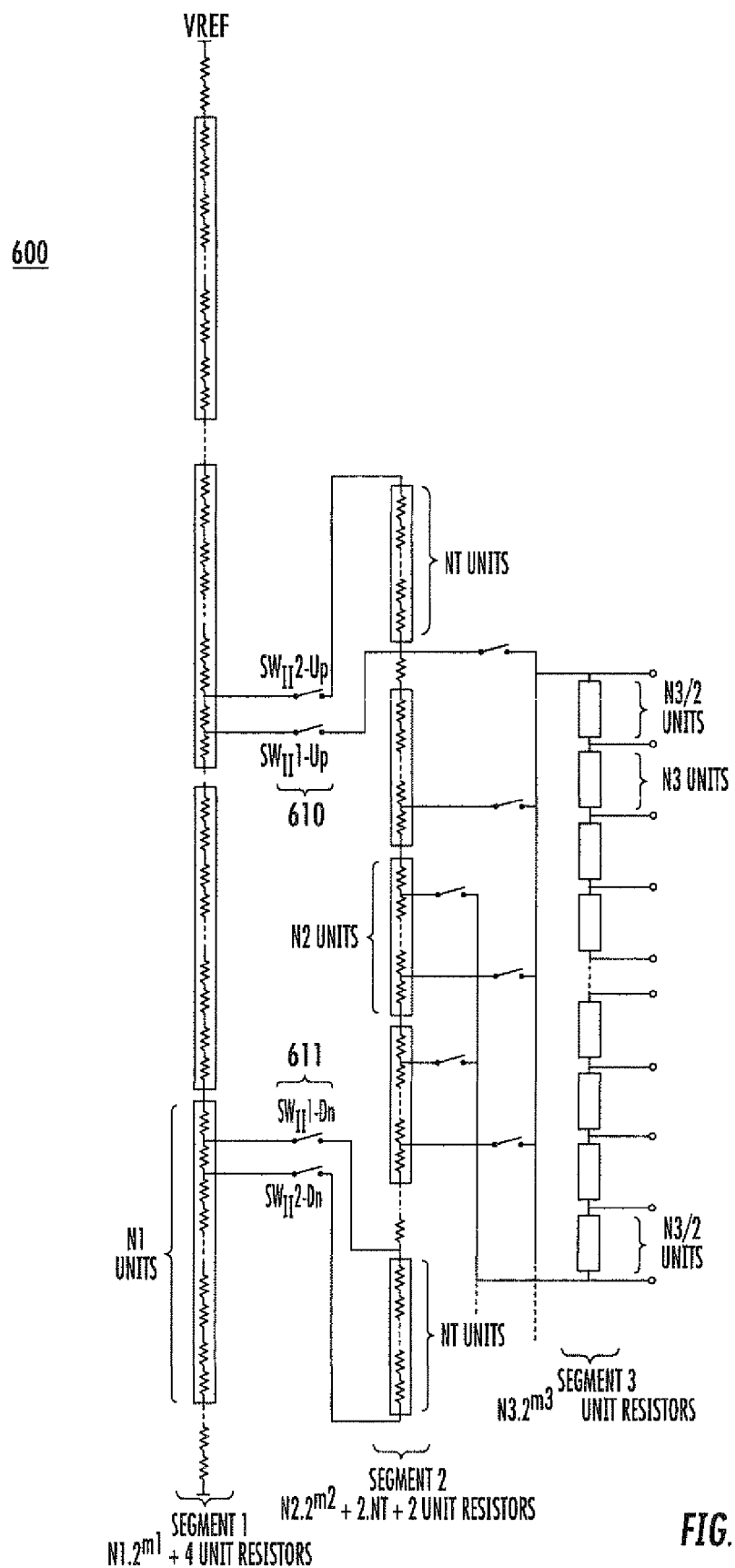
FIG. 6A shows an alternate "Truss" architecture that partially cancels current through the switches of the first segment.
Figure 6B:
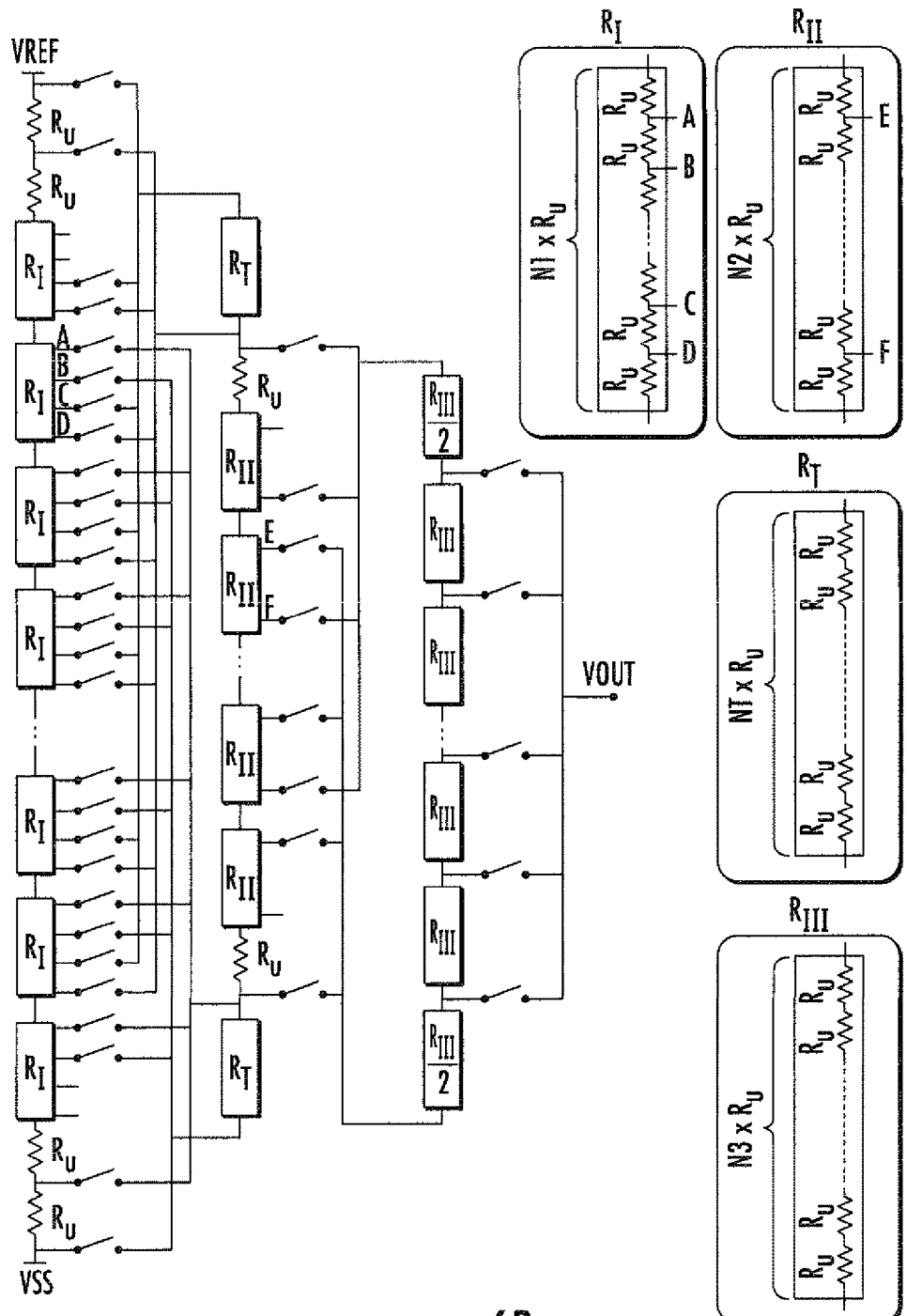
FIG. 6B shows more detailed schematic an alternate "Truss" architecture that partially cancels current through the switches of the first segment.
Figure 7:
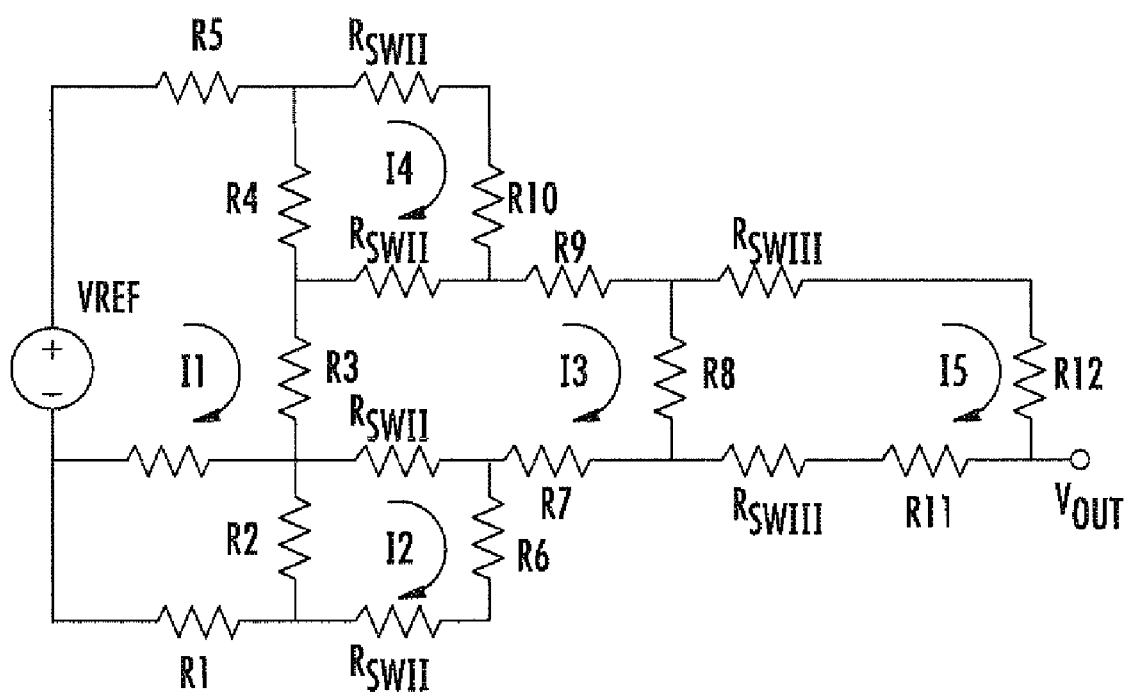
FIG. 7 is a simplified network model of the architecture of FIG. 6B.

DAC output voltage sensitivity to switch resistances can be abated by reducing the current flowing through them. FIG. 6A shows a "Truss" architecture 600 that partially cancels the current through the switches 610 and 611 that connects second segment to the first segment. FIG. 6B is a more detailed representation of this "Truss" architecture. A simplified model of this "first order" architecture is shown in FIG. 7. The resistance of the switches SWII1-Up, SWII2-Up, SWII1-Dn, SWII2-Dn are almost equal and are modeled by $R_{SWII}$ in the network of FIG. 7 The resistors R6 and R10 in the model are each comprised of NT unit resistors and are chosen such that I4=I2≈I3. Under this condition the current through switches SWII1-Up and SWII1-Dn are reduced by a factor of ~|(I4−I3)/I3| and ~≡(I2−I3)/I3|, respectively. An estimate for NT can be obtained by:

$$NT \approx \text{Int}\left( \frac{N2 \cdot 2^{m2}}{N1+2} \right) \tag{11}$$

In general a numerical routine will yield a more optimized value for NT when switch resistances and numerical rounding of N1, N2, and N3 as discussed in the Appendix are taken into consideration.

One disadvantage of this architecture is that it introduces a systematic gain error of $$\text{Gain Error}[\% \ FSR] = \frac{2}{N1 \cdot 2^{m1}+2} 100 \tag{12}$$

However, this error is typically lest than 0.2% Full Scale Range (FSR) and is usually negligible compared to rail-to-rail output buffer top and bottom saturation zones. FIGS. 8A and 8B show the resulting DAC linearity after switch current cancelation trusses are added. A comparison of FIGS. 8A and 8B with FIGS. 5A and 5B indicates close to ten fold reduction in DNL and seven times reduction in INL sensitivity to switch resistances.

The errors introduced by additional, SWII2-Up, SWII2-Dn switches of current cancelation loops can in turn be reduced by adding additional current canceling loops forming a second order switch current cancellation architecture.

Figure 9:
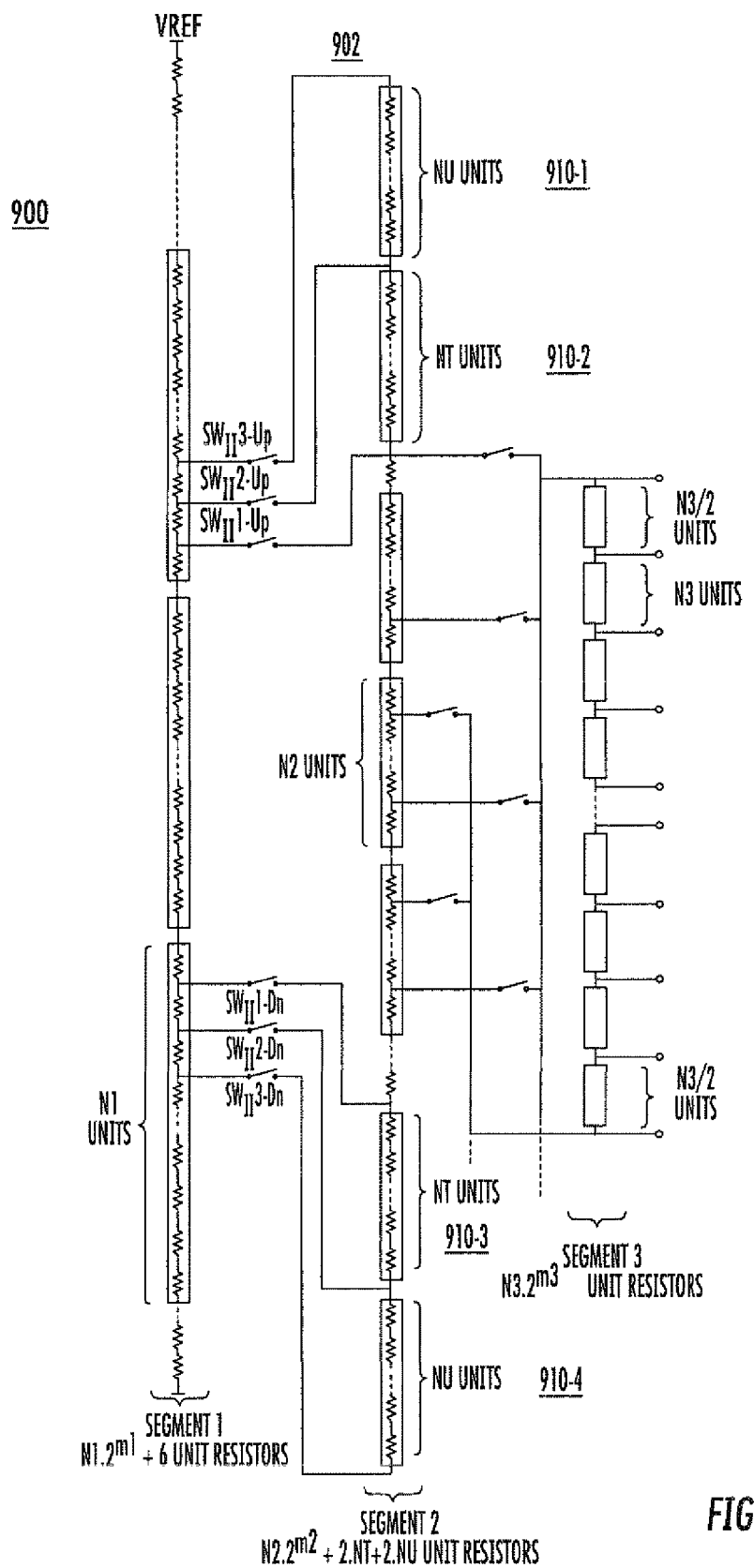
FIG. 9 is an architecture that implements second order current cancellation where two additional subsegments are added to each of a top and bottom of the second segment.
Figure 10:
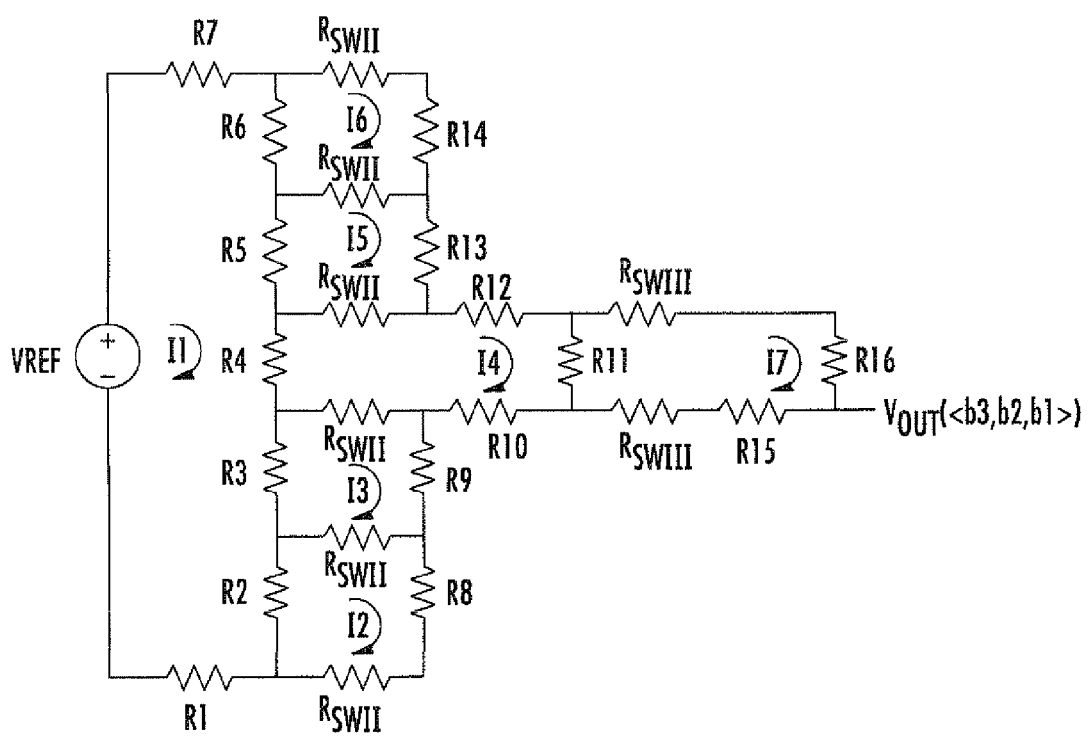
FIG. 10 is a network model of the implementation of FIG. 9.

A DAC 900 architecture which implements a second order current cancellation is shown in FIG. 9. Here, two additional sub-segments of NU units 910-1, 910-4 and two NT units 910-2, 910-3 are added to each of the top and bottom of the second segment 902. A network model of this implementation is shown in FIG. 10.

The gain error of the second order current cancellation is almost twice as large as the first order architecture and is given by $$\text{Gain Error}[\% \ FSR] = \frac{4}{N1 \cdot 2^{m1} + 4} 100 \quad (13)$$

However, simulations show that linearity improvement of the second order architecture does not justify the added complexity.

The first order current cancellation architecture of FIG. 6A and FIG. 6B provides good DNL performance while avoiding routing and switching complexity of the second order current cancellation architecture. Table 1 shows a comparison between these three proposed architectures as of FIG. 9 implemented for an 18 Bit DAC with m1=m2=m3=6. The second order current cancellation delivers little DNL and INL improvement despite further reducing currents through the second segment switches. This is mainly due to dominance of the third segment switches at these DNL and INL levels.

TABLE 1

Comparison of the three architectures.

| Parameter | No current Cancellation FIG. 2 | First-order Current Cancellation FIG. 6B | Second-order Current Cancellation FIGS. 8A and 8B |
|---|---|---|---|
| Resolution | 18 | 18 | 18 |
| m1/n1 | 6/43 | 6/43 | 6/43 |
| m2/n2 | 6/15 | 6/15 | 6/15 |
| m3/n3 | 6/2 | 6/2 | 6/2 |
| Ladder Resistance [KΩ] | 125 | 125 | 125 |
| Unit RU [Ω] | 45.42 | 45.40 | 45.35 |
| Switch Resistance (e.g.) | Unit R | Unit R | Unit R |
| Switch Current Reduction factor | 1 | 0.16 | 0.029 |
| INL (max/min) | 10.3/−10.3 | 1.6/−1.6 | 0.8/−0.8 |
| DNL (max/min) | 10.5/−0.015 | 1.7/−0.03 | 0.8/−0.015 |
| Gain Error % | −0.003 | −0.07 | −0.14 |
| Total # of Switches | 320 | 448 | 576 |

Figure 11A:
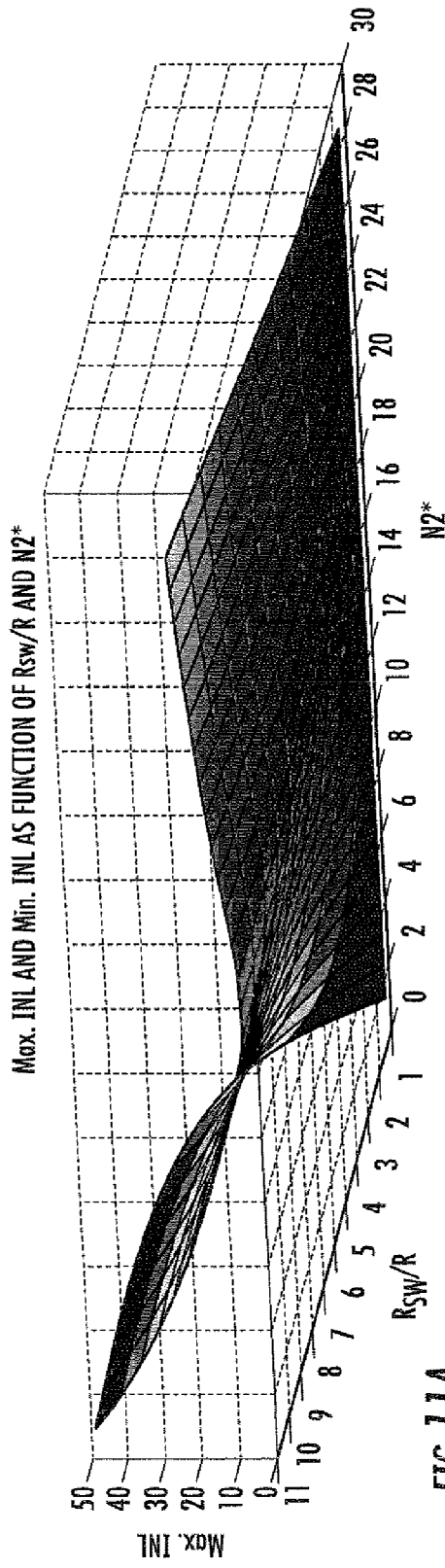
FIGS. 11A and 11B are similar plots respectively showing minimum and maximum INL as a function of number of unit element resistance in the Truss loop.
Figure 11B:
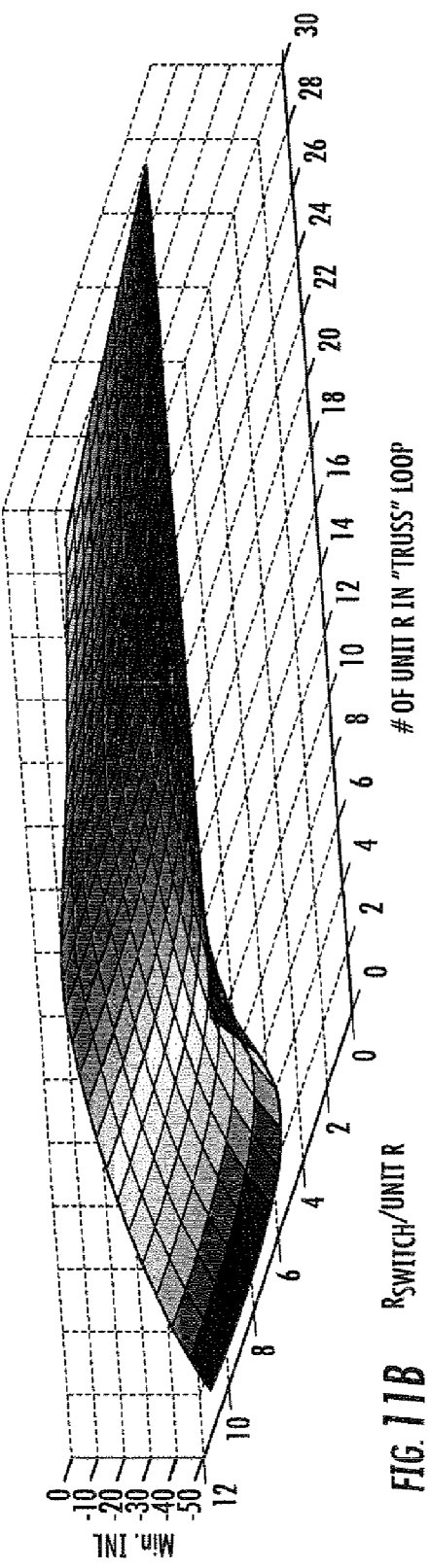

FIGS. 11A and 11B illustrate results of a simulation to determine the maximum and minimum INL as a function of the resistance of the unit element resistor in the "truss" loop and the switch resistances. The plot of FIG. 11A is for maximum INL and the plot of FIG. 11B is for minimum INL. It is instructive to see that there are relatively flat regions of these curves indicating that the overall sensitivity to switch resistances does not vary much with process variables once a certain number of unit resistors is exceeded (i.e., from about 6 to 8). Comparison of the plots can help determine the correct number of unit element resistors (NT) that optimizes both the minimum and maximum INL.

Figure 12A:
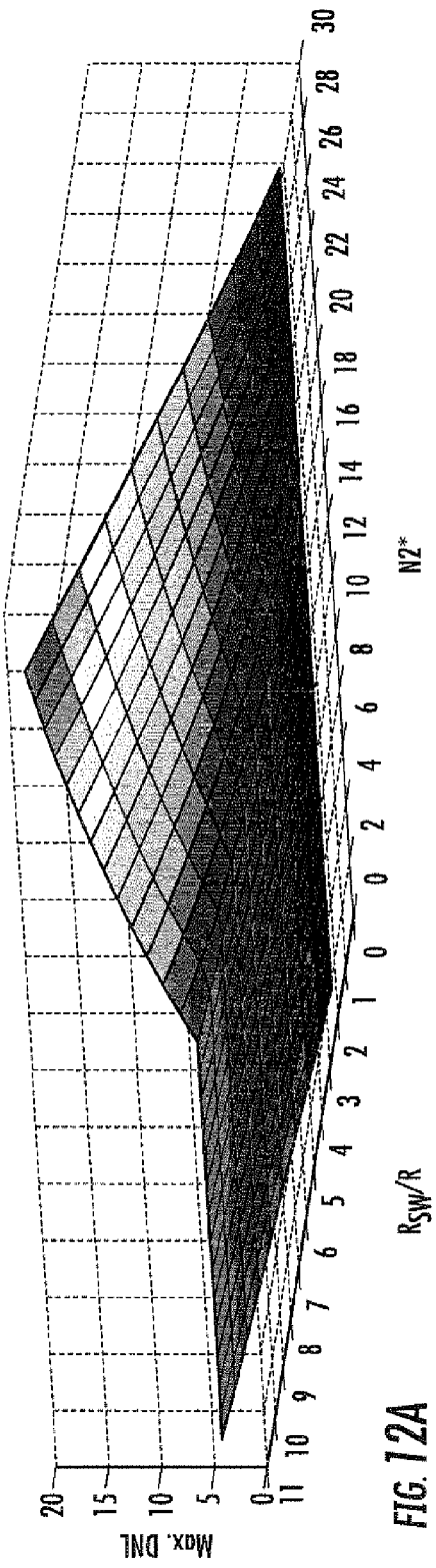
FIGS. 12A and 12B are similar plots respectively showing minimum and maximum DNL as a function of number of unit element resistance in the Truss loop.
Figure 12B:
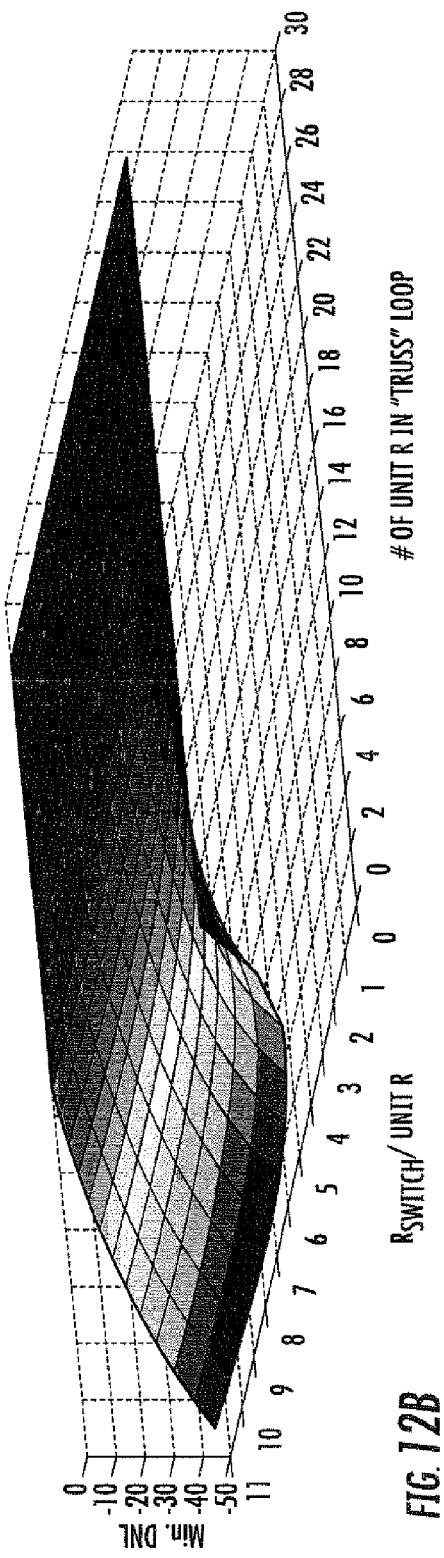

FIGS. 12A and 12B are similar plots showing minimum and maximum DNL as a function of unit element resistance in the truss loop. Here, the relatively flat region indicates that N2 can be chosen such that both positive and negative DNL are simultaneously reduced.

Figure 13:
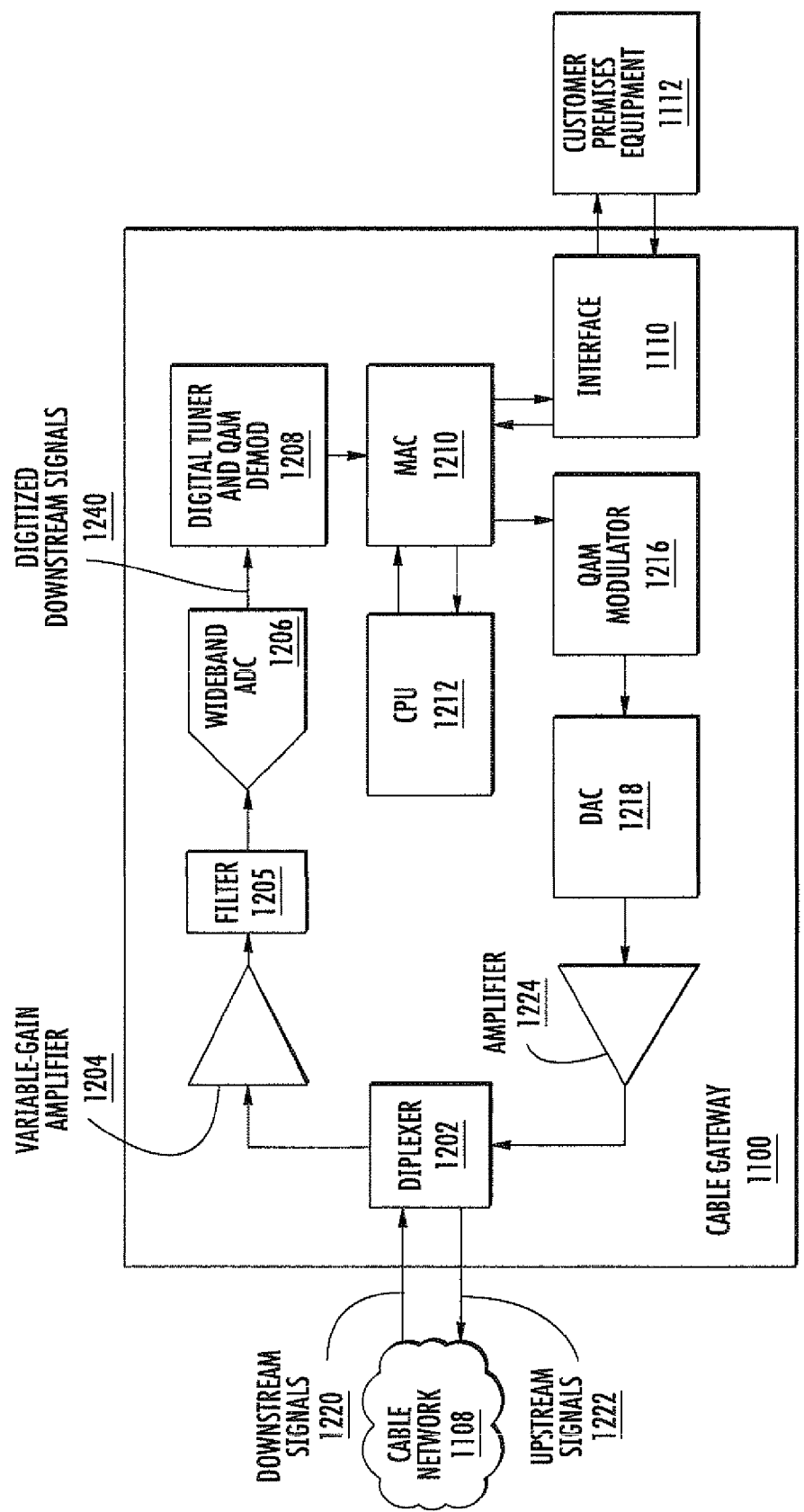
FIG. 13 is a high level diagram of a system that may use the R-DAC.

One particular use of the DACs described herein is to implement a digital radio receiver as generally shown in FIG. 13. One example implementation of such a digital transceiver is a cable gateway 1100 connected to a cable network 1108, which may be a coaxial, optical fiber, or hybrid fiber/coaxial cable television (CATV) network. The cable gateway 1100 which transmits data to and receives data from customer premises equipment 1112. Typically, customer premises equipment 1112 includes computers, televisions, and telephones. The cable gateway 1100 disclosed herein can be configured to operate according to any suitable specification for transmitting and receiving data, including but not limited to DOCSIS 3.0, Comcast RNG, SCTE 40, T3/S10 ATSC, or OpenCable specifications.

Certain specifications require cable modems and cable gateways to tune multiple 6 MHz channels for receiving television, voice, and data signals. (For example, DOCSIS 3.0 specifies the ability to independently tune at least four channels.) The ability to tune multiple channels is necessary to watch different television channels on different televisions.

Unlike conventional cable gateways, the cable gateway 100 shown in FIG. 1 uses a wideband, time-interleaved, analog-to-digital converter (ADC) 1206 to digitize signals received from the cable network 1108. The output from the wideband ADC can be tuned digitally, rather than with analog tuners, resulting in lower power consumption compared to alternative methods.

More particularly, in the example cable gateway 1100, signals transmitted to and from the cable network 1108 are coupled via a diplexer 1202, which separates downstream signals 1220 from upstream signals 1222. In general, CATV networks are asymmetric networks: the bandwidth dedicated to the downstream signals 1220 is greater than the bandwidth dedicated to the upstream signals 1222.

The diplexer 1202 directs downstream traffic to a variable-gain amplifier (VGA) 1204, which amplifies the received signal before transmitting it through a filter 1205 to a wideband ADC 1206. The time-interleaved ADC 1206 digitizes the received signal, then passes the digitized downstream signals 1240 to a digital tuner and quadrature-amplitude-modulation (QAM) demodulator 1208. (Alternative embodiments may use other suitable modulation schemes.) In some embodiments, the digital tuner and QAM demodulator 208 tunes and demodulates the amplified, filtered, and digitized downstream signals 1240 in accordance with either 64-QAM or 256-QAM techniques to recover the underlying information.

A media access controller (MAC) 1210 and a central processing unit (CPU) 1212 process the demodulated downstream signals 1222 from the digital tuner and QAM demodulator. In example embodiments, the MAC 1210 is an open system interconnection (OSI) layer-2 element that frames the data into Internet Protocol (IP) packets or frames according to DOCSIS 3.0. (All DOCSIS-compatible devices are expected to be backwards compatible, meaning that embodiments compatible with DOCSIS 3.0 are necessarily compatible with earlier DOCSIS standards.) The MAC may also route encoded video and audio signals to customer-premises equipment. The functions of the MAC 210 may be implemented in hardware, software, or a combination of the two. Software implementations may be stored in read-only memory or random-access memory (not shown) and executed by the CPU 1212.

The MAC 210 transmits packets and frames to customer-premises equipment 1112 via an interface 1110. Customer premises equipment 1112 may be a telephone, a television, and/or a computer. In various embodiments, the interface 1110 may be a universal serial bus (USB) interface, an IEEE 1394 interface, or any other suitable interface.

In addition to receiving processed downstream traffic 1220, customer premises equipment 1112 may also transmit data through the upstream channel 1222 of the cable network 1108 via the cable modem 1100. The interface 1110 transmits data from customer premises equipment 1112 to the MAC 1210, which formats the data, then sends it to a QAM modulator 1216. Again, alternative embodiments may use other modulation schemes.

A digital-to-analog converter (DAC) 1216, implement using the techniques described herein, converts the modulated digital signals into an analog output, which is amplified by an amplifier 1224. In certain embodiments, the QAM modulator can provide both the digital signal bits as well as a modulated reference voltage (VREF) to the DAC 1216. In this implementation, the DAC 1216 is thus arranged as a multiplying DAC. The diplexer 1202 directs the output of the amplifier 1220 to the cable network 1108 over the upstream channel 1222. In embodiments, the QAM modulator 1216, the DAC 1218, and the amplifier 1224 typically operate over lower bandwidths than the QAM demodulator 1208, the wideband ADC 1206, and the VGA 1204.

It will this be appreciated that the unbuffered, unsegmented R-DAC techniques described earlier can be applied to implement the DAC 1218, or even to implement portions of the ADC 1206 in such a transceiver.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus comprising:
   a first resistor segment having a plurality of sub-segments, each sub-segment comprising one or more resistor elements;
   a second resistor segment having a plurality of sub-segments, each sub-segment comprising one or more resistor elements;
   a plurality of switches interconnecting the sub-segments of the first and second segments;
   at least one sub-segment having an upper additional resistor element and a lower additional resistor element, the upper additional resistor element being disposed between a first switch and a first adjacent sub-segment, and the lower additional resistor element being disposed between a second one of the switches and a second adjacent sub-segment; and
   further wherein
   the resistor elements in each of the sub-segments of the first resistor segment further each comprise a plurality, N1, of unit resistors, each unit resistor having a unit resistance $R_U$;
   the resistor elements in each of the sub-segments of the second resistor segment further each comprise a plurality, N2, of unit resistors, each unit resistor also having a unit resistance $R_U$, and where m2 is the number of sub-segments in the second resistor segment; and
   the upper and lower additional resistor elements further comprise a plurality, NT, of unit resistors where NT depends on $$\frac{N2 \cdot 2^{m2}}{N1+2}.$$

2. The apparatus of claim 1 wherein the upper additional resistor element is a resistive element connected in series between a first switch and a first adjacent sub-segment, and the lower additional resistor element is a resistive element connected in series between a second switch and a second adjacent sub-segment.

3. The apparatus of claim 1 wherein a total resistance of at least one of the upper and lower additional resistor elements is chosen such that a current flowing through the upper additional resistor element is approximately equal to a current flowing through the lower additional resistor segment.

4. The apparatus of claim 1 wherein a total resistance of a selected one of the upper and lower resistor elements is chosen such that a current flowing through the selected one of the additional resistor elements is approximately equal to an output current for the first segment.

5. The apparatus of claim 1 additionally comprising:
   a third resistor segment having a plurality of sub-segments, each sub-segment comprising one or more resistor elements;
   a plurality of switches interconnecting the sub-segments of the second and third segments; and
   both the first and second segments having at least one sub-segment with an upper additional resistor element and a lower additional resistor element, the upper additional resistor element being disposed between a first switch and a first adjacent sub-segment, and the lower additional resistor element being disposed between a second one of the switches and a second adjacent sub-segment.

6. The apparatus of claim 5 wherein a resistance of the upper and lower resistor elements in the first segment are each chosen to compensate for current flowing through selected ones of the switches interconnecting the sub-segments of the first and second segments.

7. The apparatus of claim 6 wherein a resistance of the upper and lower resistor elements in the second segment are each chosen to compensate for current flowing through selected ones of the switches interconnecting the sub-segments of the second and third segments.

8. The apparatus of claim 1 additionally comprising:
   a transceiver, for forwarding an input signal to the first resistor segment.

9. The apparatus of claim 8 wherein the transceiver additionally comprises:
   a media access controller, coupled to receive a cable signal from customer premises equipment;
   a quadrature amplitude modulator, coupled to receive the cable signal from the media access controller, and provide the input signal to the first resistor segment; and
   an amplifier, for amplifying an output signal provided by one of the subsegments.

10. A method comprising:
    operating one or more switches disposed between a first resistor segment and a second resistor segment, the first resistor segment comprising a plurality of sub-segments each comprising two or more resistor elements, and the second resistor segment comprising a second plurality of sub-segments, each comprising two or more resistor elements;
    compensating for loading of the second resistor segment on the first resistor segment with the resistor elements in each of the sub-segments of the first resistor segment further comprise a number, N1, where N1 is greater than two, of unit resistors, with each unit resistor having a unit resistance $R_U$;
    with the resistor elements in each of the sub-segments of the second resistor segment further comprise a number, N2, where N2 is greater than two, of unit resistors, with each unit resistor also having a unit resistance $R_U$,
    where m2 is the number of sub-segments in the second resistor segment; and the upper and lower additional resistor elements further comprise a plurality, NT, of unit resistors where NT depends on both N1 and N2.

11. The method of claim 10 wherein the step of compensating for loading additionally comprises:
operating the switches to connect at least one sub-segment having an upper additional resistor element and a lower additional resistor element to the first resistor segment, such that the upper additional resistor element is connected between a first one of the switches and a first adjacent sub-segment; and
the lower additional resistor element is connected between a second one of the switches and a second adjacent sub-segment.

12. The method of claim 11 additionally comprising:
connecting in series the upper additional resistor element as a single resistive element between the first switch and the first adjacent sub-segment, and
connecting in series the lower additional resistor as a resistor element between the second switch and the second adjacent sub-segment.

13. The method of claim 11 wherein a total resistance of at least one of the upper and lower resistor elements is chosen such that a current flowing through the upper additional resistor element is approximately equal to a current flowing through the lower additional resistor segment.

14. The method claim 11 wherein a total resistance of a selected one of the upper and lower additional resistor elements is shown such that a current flowing through the selected one of the additional resistor elements is approximately equal to an output current of the first segment.

15. The method of claim 10 additionally comprising:
operating one or more switches disposed between a a third resistor segment and the second resistor segment, the third resistor segment comprising a plurality of sub-segments, each sub-segment comprising one or more resistor elements; and
compensating for loading of the third segment on the second segment by having a total resistance of a selected one of the upper and lower additional resistor elements such that a current flowing through the selected one of the additional resistor elements is approximately equal to an output current of the second segment.

16. The method of claim 15 further wherein
both the first and second segments comprise at least one sub-segment having an upper additional resistor element and a lower additional resistor element, with the upper additional resistor element is disposed between a third switch and a third adjacent sub-segment; and
the lower additional resistor element is disposed between a fourth one of the switches and a fourth adjacent sub-segment.

17. The method of claim 15 additionally comprising:
compensating for current flowing through selected ones of the switches interconnecting the sub-segments of the second and third segments via a resistance of the upper and lower resistor elements.

18. The method of claim 10 additionally comprising:
providing an input digital communication signal to the first resistor segment.

19. The method of claim 18 additionally comprising:
receiving a cable signal at a media access controller;
quadrature amplitude modulating the cable signal from the media access controller, to and provide the input digital communication signal to the first resistor segment; and
amplifying a resulting signal provided by one of the sub-segments.

* * * * *